(12) United States Patent
Ha

(10) Patent No.: US 12,063,809 B2
(45) Date of Patent: Aug. 13, 2024

(54) DISPLAY APPARATUS INCLUDING TOUCH ELECTRODE CONTACTING OLED CATHODE

(71) Applicant: LG Display Co., Ltd., Seoul (KR)

(72) Inventor: Jongmoo Ha, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 344 days.

(21) Appl. No.: 17/496,606

(22) Filed: Oct. 7, 2021

(65) Prior Publication Data

US 2022/0158128 A1 May 19, 2022

(30) Foreign Application Priority Data

Nov. 18, 2020 (KR) ........................ 10-2020-0154892

(51) Int. Cl.
| | |
|---|---|
| *H10K 50/84* | (2023.01) |
| *H10K 50/82* | (2023.01) |
| *H10K 50/844* | (2023.01) |
| *H10K 59/40* | (2023.01) |
| *H10K 50/818* | (2023.01) |
| *H10K 50/828* | (2023.01) |
| *H10K 59/122* | (2023.01) |

(52) U.S. Cl.
CPC ........... *H10K 50/844* (2023.02); *H10K 50/82* (2023.02); *H10K 59/40* (2023.02); *G09G 2300/0408* (2013.01); *H10K 50/818* (2023.02); *H10K 50/828* (2023.02); *H10K 59/122* (2023.02)

(58) Field of Classification Search
CPC .. H10K 50/844; H10K 50/82; H10K 50/8426; H10K 50/818; H10K 50/828; H10K 59/40; H10K 59/124; H10K 59/131; H10K 59/122; G09G 2300/0408
See application file for complete search history.

(56) References Cited

U.S. PATENT DOCUMENTS

| | | | |
|---|---|---|---|
| 2018/0046301 A1* | 2/2018 | Zhou | G06F 3/0445 |
| 2018/0047920 A1* | 2/2018 | Jang | B32B 27/08 |
| 2018/0095566 A1* | 4/2018 | Lee | H10K 59/351 |
| 2018/0329552 A1* | 11/2018 | Song | H10K 59/8731 |
| 2019/0036063 A1* | 1/2019 | Lee | G06F 3/0412 |

(Continued)

FOREIGN PATENT DOCUMENTS

| | | | | |
|---|---|---|---|---|
| EP | 3301547 A1 * | 4/2018 | ........... | G06F 3/0412 |
| EP | 3486759 A1 * | 5/2019 | ........... | G06F 1/1686 |
| EP | 3651002 A1 * | 5/2020 | ........... | G06F 3/0412 |

*Primary Examiner* — Ida M Soward

(74) *Attorney, Agent, or Firm* — Seed IP Law Group LLP

(57) ABSTRACT

A display apparatus according to an embodiments of the present disclosure may include a substrate including an active area and an inactive area disposed around the active area, an organic light emitting device disposed in the active area and including an anode electrode, a light emitting layer, and a cathode electrode, an encapsulation layer disposed on the organic light emitting device and including a first inorganic insulating layer, an organic insulating layer, and a second inorganic insulating layer, a touch unit disposed on the encapsulation layer and including a lower touch insulating layer, a touch electrode, and an upper touch insulating layer, a contact hole exposing an upper portion of the cathode electrode extending from the active area to the inactive area, and a contact electrode in electrical contact with the cathode electrode through the contact hole.

23 Claims, 5 Drawing Sheets

(56) References Cited

U.S. PATENT DOCUMENTS

| | | | |
|---|---|---|---|
| 2019/0129539 A1* | 5/2019 | Kim | G01R 27/2605 |
| 2019/0131354 A1* | 5/2019 | Lee | H10K 59/131 |
| 2019/0131379 A1* | 5/2019 | Won | H10K 59/40 |
| 2019/0189731 A1* | 6/2019 | Managaki | G06F 3/0443 |
| 2020/0027416 A1* | 1/2020 | Kim | H01L 27/124 |
| 2020/0152707 A1* | 5/2020 | Won | H10K 50/844 |
| 2020/0168851 A1* | 5/2020 | Managaki | H05B 33/22 |

\* cited by examiner

DISPLAY APPARATUS INCLUDING TOUCH ELECTRODE CONTACTING OLED CATHODE

CROSS REFERENCE TO RELATED APPLICATION

This application claims priority from Korean Patent Application No. 10-2020-0154892, filed on Nov. 18, 2020, which is hereby incorporated by reference for all purposes as if fully set forth herein.

BACKGROUND

Technical Field

The present disclosure relates to a display apparatus.

Description of the Related Art

As the information age enters, the field of display visually expressing electrical information signals has rapidly developed, and in response to this, various display apparatus with excellent performance such as thinner, lighter, and low power consumption are being developed.

Examples of the display apparatus may include a liquid crystal display apparatus (LCD), an organic light emitting display apparatus (OLED), a quantum dot display apparatus (QD), and the like.

An organic light emitting display apparatus may include a display panel and a plurality of components for providing various functions. For example, one or more display driving circuits for controlling the display panel may be included in a display assembly. Examples of driving circuits may include gate drivers, light emitting (source) drivers, power (VDD) routing, electrostatic discharge (ESD) circuits, multiplex circuits, data signal lines, cathode contacts, and other functional elements. A plurality of peripheral circuits for providing various types of additional functions, for example, touch sensing or fingerprint identification functions, may be included in the display assembly. Some components may be disposed on the display panel, or may be disposed on areas adjacent to the display area, which are non-display areas or inactive areas. In addition, an organic light-emitting device used in an organic light emitting display apparatus is a self-luminous device in which a light-emitting layer is formed between two electrodes. A light-emitting device is a device which injects electrons and holes into the light emitting layer through the electron injection electrode (e.g., cathode) and the hole injection electrode (e.g., anode), respectively, and emits light when the exciton combined with the injected electrons and holes falls from the excited state to the ground state. The electron injection electrode may be an upper electrode or a cathode, and the hole injection electrode may be a lower electrode or an anode. The cathode electrode may be required to be connected to a low potential power line, and a contact structure for connection may be disposed in the inactive area.

The size of the display apparatus is a very important factor in design, and in particular, a high ratio of the size of the active area to the size of the inactive area, referred to as a screen-to-bezel ratio, may be one of the main characteristics of the display apparatus.

BRIEF SUMMARY

However, the inventors have realized that it may require a large inactive area for placing some of the above-described components within the display assembly and arranging the contact structure between the cathode electrode and the low-potential power line outside the component. The contact structure disposed outside the component between the cathode electrode and the low-potential power line can be easily exposed to external moisture caused by a cut surface of a substrate at the outermost part of the inactive area or a crack of the cut surface of the substrate. Accordingly, the inventors have recognized that in order to protect the outer portion of the contact structure between the cathode electrode and the low-potential power line from external moisture permeation, a specific distance is beneficial from the cut surface of the substrate, and there is a restriction on the reduction of the bezel area.

As various display apparatus have been developed, users prefer to have a larger screen-to-device ratio for mobile products. In order to increase the screen-to-device ratio, efforts are being made to implement a narrow bezel that specifically reduces the size of the inactive area compared to the active area.

For the narrow bezel, it may be beneficial for various technologies including the arrangement of components such as a gate driver or ESD, and an optimal driving method. In addition, in order to protect the organic light emitting device in the active area from external oxygen or moisture while efficiently using the space of the inactive area, it may be beneficial to appropriately arrange a sealing layer and a moisture permeation prevention structure.

In addition, it is beneficial to simplify or optimize the structure of grounding the cathode electrode for the narrow bezel.

The aspects of the present specification are not limited to the aspects mentioned above, and other aspects not mentioned will be clearly understood by those skilled in the art from the following description.

A display apparatus in accordance with an embodiment of the present disclosure may include a substrate including an active area and an inactive area disposed around the active area, an organic light emitting device disposed in the active area and including an anode electrode, a light emitting layer, and a cathode electrode, an encapsulation layer disposed on the organic light emitting device and including a first inorganic insulating layer, an organic insulating layer, and a second inorganic insulating layer, a touch unit disposed on the encapsulation layer and including a lower touch insulating layer, a touch electrode, and an upper touch insulating layer, a contact hole exposing an upper portion of the cathode electrode extending from the active area to the inactive area, and a contact electrode in electrical contact with the cathode electrode through the contact hole.

A display apparatus in accordance with an embodiment of the present disclosure may include a substrate including an active area and an inactive area disposed around the active area, an organic light emitting device disposed in the active area and including an anode electrode, a light emitting layer, and a cathode electrode, an encapsulation layer disposed on the organic light emitting device, a touch unit disposed on the encapsulation layer and including a lower touch insulating layer, a touch electrode, and an upper touch insulating layer, a contact hole exposing an upper portion of the cathode electrode by removing a portion of the lower touch insulating layer and the encapsulation layer, which the cathode electrode, the encapsulation layer and the lower touch insulating layer extending from the active area to the inactive area, and a contact electrode in electrical contact with the cathode electrode through the contact hole.

Details of embodiments are included in the detailed description and drawings.

According to the embodiments of the present disclosure, it is possible to reduce or minimize an inactive area outside an active area or the side bezel area of the panel among the inactive areas by simplifying the cathode electrode grounding structure for driving the organic light emitting device.

More specifically, according to the embodiments of the present disclosure, it is possible to simplify the connection structure between an intermediate electrode formed of the same material as the cathode and anode electrodes used in the bezel area, and a low-potential power line formed of the same material as the source and drain electrodes.

In addition, it is possible to shorten the bezel area occupied by the connection structure for grounding of the cathode electrode by simplifying the connection structure of the cathode electrode, the intermediate electrode, and the low-potential power line.

Accordingly, it possible to provide a display apparatus capable of allowing a user to use a device with a light emitting screen full on the front of the display device, and of providing a superior grip feeling to users and having a lighter weight.

Since the contents described in the summary above do not specify essential features of the claims, the scope of the claims is not limited by the contents described in the summary or the detail description of this disclosure.

DETAILED DESCRIPTION

Figure 1:
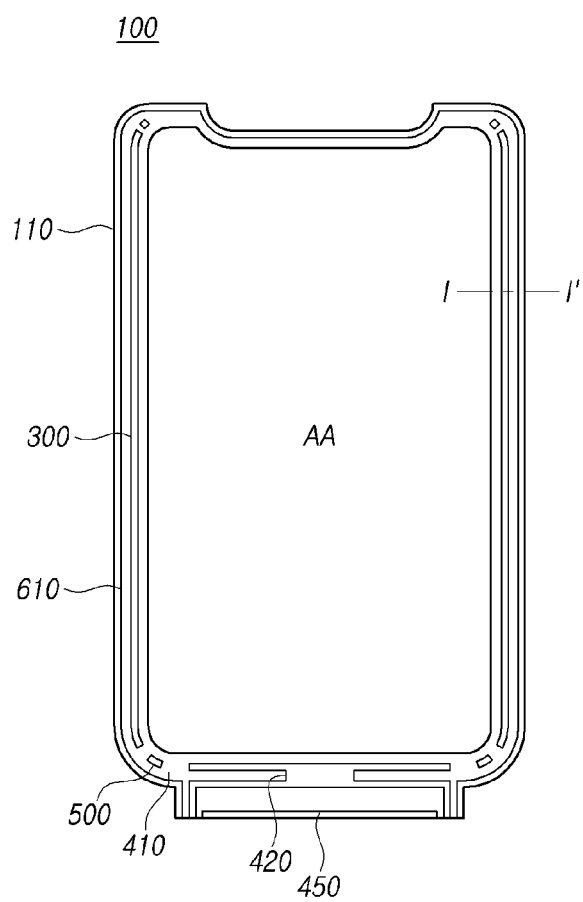
FIG. 1 is a plan view of a display panel according to an embodiment of the present disclosure.

The advantages and features of the present disclosure and methods of achieving the same will be apparent by referring to embodiments of the present disclosure as described below in detail in conjunction with the accompanying drawings. However, the present disclosure is not limited to the embodiments set forth below, but may be implemented in various different forms. The following embodiments are provided only to completely disclose the present disclosure and inform those skilled in the art of the scope of the present disclosure.

In addition, the shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in the following description of the present disclosure, detailed description of well-known functions and configurations incorporated herein will be omitted when it is determined that the description may make the subject matter in some embodiments of the present disclosure rather unclear. The terms such as "including," "having," "containing," "comprising of," and "consist of" used herein are generally intended to allow other components to be added unless the terms are used with the term "only." Singular forms used herein are intended to include plural forms unless the context clearly indicates otherwise.

In interpreting any elements or features of the embodiments of the present disclosure, it should be considered to include a tolerance or error range even when a specific description is not conducted.

In the description related to spatial relationship, for example, when the positional relationship of two element is described using the terms of "on," "upper," "above," "below," "under," "beneath," "lower," "near," "close," "adjacent," it should be interpreted that one or more elements may be further "interposed" between the elements unless the terms such as "directly," "only" are used.

In the description related to time relationship, for example, time relative terms, such as "after," "subsequent to," "next to," "before," or the like, used herein to describe a temporal relationship between events, operations, or the like are generally intended to include events, situations, cases, operations, or the like that do not occur consecutively unless the terms, such as "directly," "immediately," or the like, are used.

When the terms, such as "first," "second," or the like, are used herein to describe various elements or components, it should be considered that these elements or components are not limited thereto. These terms are merely used herein for distinguishing an element from other elements. Therefore, a first element mentioned below may be a second element in a technical concept of the present disclosure.

In describing the constituent elements of the present disclosure, terms such as first, second, A, B, (a), and (b) may be used. These terms are for distinguishing the constituent element from other constituent elements, and the nature, order, order, or number of the constituent element is not limited by the term. When a component is described as being "connected," "coupled" or "connected" to another component, that component may be directly connected or connected to that other component, however, it should be understood that other components may be "interposed" between each component, or that each component may be "connected," "coupled" or "connected" through other components.

In the present disclosure, the term "display apparatus" or "display device" may include display device in a narrow meaning such as a liquid crystal module (LCM), an OLED module, and a quantum dot module including a display panel and a driver for driving the display panel. It may also include a display device of a laptop computers, televisions, computer monitors which are complete products or final products including LCM, OLED modules, QD modules, an equipment display including an automotive display or other form of a vehicle, and a set electronic device or a set device such as a mobile electronic device including a smart phone or an electronic pad.

Accordingly, the display device in the present disclosure may include a display device in narrow meaning, such as an LCM, an OLED module, a QD module, etc., and an application product including an LCM, an OLED module, a QD module, etc., or a set device as an end consumer device.

In addition, in some cases, an LCM, OLED module, and QD module including a display panel and a driving unit may be expressed as a "display device" in the narrow meaning, and an electronic device as a finished product including LCM, OLED module, and QD module may be separately expressed as a "set device." For example, the display device in the narrow meaning may include a display panel of liquid crystal (LCD), organic light emitting (OLED), or quantum dot, a source PCB as a control unit for driving the display panel. The set device may further include a set PCB as a set control unit which is electrically connected to the source PCB and controls the entire set device.

The display panel used in embodiments may include all types of display panels such as a liquid crystal display panel, an organic light emitting diode (OLED) display panel, a quantum dot (QD) display panel, and an electroluminescent display panel. The organic light emitting diose (OLED) display panel of the present embodiment is not limited to a specific display panel capable of bezel bending with a flexible substrate and a lower backplay support structure. In addition, the display panel used in the display device according to the embodiment of the present specification is not limited to the specific shape or size of the display panel.

For example, if the display panel is an organic light emitting diode (OLED) display panel, it may include a plurality of gate lines and data lines, and pixels formed in an overlapping area between the gate lines and data lines. In addition, the display panel may include an array including a thin film transistor which is an element for selectively applying a voltage to each pixel, an organic light emitting device layer on the array, and an encapsulation substrate or an encapsulation layer disposed on the array to cover the organic light emitting device layer. The encapsulation layer may protect the thin film transistor and the organic light emitting device layer from external impact, and prevent moisture or oxygen from penetrating into the organic light emitting device layer. In addition, the layer formed on the array may include an inorganic light emitting layer, for example, a nano-sized material layer or a quantum dot.

In this disclosure, FIG. 1 illustrates an organic light emitting display panel 100 that may be incorporated into display devices.

FIG. 1 is a plan view of a display panel according to an embodiment of the present disclosure. Referring to FIG. 1, an organic light emitting display panel 100 includes at least one active area AA in which organic light emitting devices and an array for driving the organic light emitting device are formed.

The display panel 100 may include an inactive area disposed around the active area AA, and the top, bottom, left and right of the active area AA may be referred to as the inactive area. The active area AA may have a rectangular shape or a round shape with a notch and a rounded corner. Various types of display devices such as a circle, an oval, or a polygon shape may be applied to a smart watch or a display device for a vehicle. Accordingly, the arrangement of the inactive area surrounding the active area AA is not limited to the organic light emitting display panel 100 illustrated in FIG. 1. Various components for driving the light emitting devices and arrays formed in the active area AA may be located in the left and right inactive areas, thereby providing a function for stable light emission. For example, there may be circuits such as a gate-in-panel (GIP) 300 and an electrostatic discharge (ESD) 500, a region for contact between an upper electrode or cathode which is a part of the light emitting device and a low potential voltage (VSS) line 410 as a voltage reference point of the organic light emitting device, and a plurality of dam structures to prevent overflowing to the outside of the display panel 100 during the depositing process of a foreign matter compensation layer among the encapsulation layers to protect the organic light emitting device from external moisture or foreign matter. In addition, there may be disposed a crack stopper structure for preventing cracks from being transferred into the display panel 100 during a scribing process for dividing the mother substrate into individual display panels 100, and a moisture permeation prevention structure 430 for preventing oxygen or moisture from penetrating into the organic light emitting device in the active area from the outside of the display panel 100.

The crack stopper structure 460 of the present disclosure can prevent the impact generated on a trimming line of the substrate 100 during the scribing process from reaching and destroying the GIP 300 or ESD 500 or low-potential power (VS S) lines 410 formed in the inactive area. Alternatively, the crack stopper structure may prevent dark spots from growing or pixel shrinkage from being caused due to a moisture permeation path to the organic light emitting device or array formed in the active area AA.

The crack stopper structure 460 may be formed of an inorganic layer or an organic layer, and may be formed of a multilayer structure of an inorganic layer and an organic layer, but is not limited thereto. In FIG. 1, it is illustrated that the crack stopper structure 460 is disposed only on both sides of the long side and one side of the short side of the display panel 100, but is not limited thereto.

In a region adjacent to the trimming line of the substrate 110 which is outside the crack stopper structure 460, a part or the entire of the insulating layer (GI, buffer layer, etc.) deposited on the entire surface in forming the active area AA may be etched. A small amount of the insulating layer is left on the upper portion of the substrate 110 or the upper surface of the substrate is completely exposed through etching, so that a cutting impact may not be transferred to the corresponding insulating layer.

The display panel 100 according to an embodiment may include a thin film transistor array substrate including a plurality of pixels defined by a plurality of gate lines and a plurality of data lines, and a thin film transistor provided in each pixel to drive each pixel, an organic light emitting device layer provided on the thin film transistor array substrate, and an encapsulation layer covering the organic light emitting device layer. Here, the encapsulation layer protects the thin film transistor and the organic light emitting device layer from external impact, and prevents moisture from penetrating into the organic light emitting device layer.

Referring to FIG. 1 in a lower area of the display panel 100, there may be disposed an FPCB which is electrically connected to a pad 450 formed to receive external power and a data driving signal or to exchange a touch signal. There may be disposed a high-potential power (VDD) line 420, a low-potential power (VSS) line 410, and/or data voltage lines extending from the FPCB. The low-potential power line 410 is used to form a reference voltage of a device in the active area AA, and may be disposed to surround the active area AA in order to lower resistance. The high-potential power line 420 and the low-potential power line 410 may be disposed in the vicinity of the pad 450 of the same material as the source/drain electrodes of the thin film transistor. However, the low-potential power line 410 may be connected to a contact electrode 610 in the vicinity of a region where the ESD 500 to the gate driver 300 is disposed, through another lines. The contact electrode 610 may be disposed to surround three sides of the active area AA except for one side on which the pad 450 is disposed, and may have a connection structure for connecting to the upper electrode.

The data voltage line of the present disclosure may be connected to and disposed toward a data driver IC that generates a light emitting signal of the light emitting device.

The area in which the pad 450 described above is disposed may be a second component forming part. A portion of the high-potential power line 420 and the low-potential power line 410 may be disposed in the second component forming part.

A member connected to the pad 450 formed on the upper surface of the display panel 100 is not limited to the FPCB, and various members can be connected, and the pad 450 may be disposed on the upper or the rear surface of the display panel 100.

The substrate 110 as a base of the display panel 100 may be formed of various materials such as glass, metal, or plastic. In the case that the substrate 110 is a flexible substrate, for example, the substrate may include polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC) or a polymer resin such as cellulose acetate propionate (CAP). In addition, the substrate 110 may have a structure including two plastic substrates and an inorganic layer between the two plastic substrates. The two plastic substrates may include the above-described polymer resin, and may have the same or different thickness. For example, each of the two plastic substrates includes polyimide and may have a thickness of 3 μm to 20 μm, respectively. The inorganic layer is a barrier layer for preventing the penetration of foreign substances, and may be a single layer or a multilayer including an inorganic material such as silicon nitride (SiNx) and/or silicon oxide (SiOx). The inorganic layer may have a thickness of about 6000 Å, but is not limited thereto.

Figure 2:
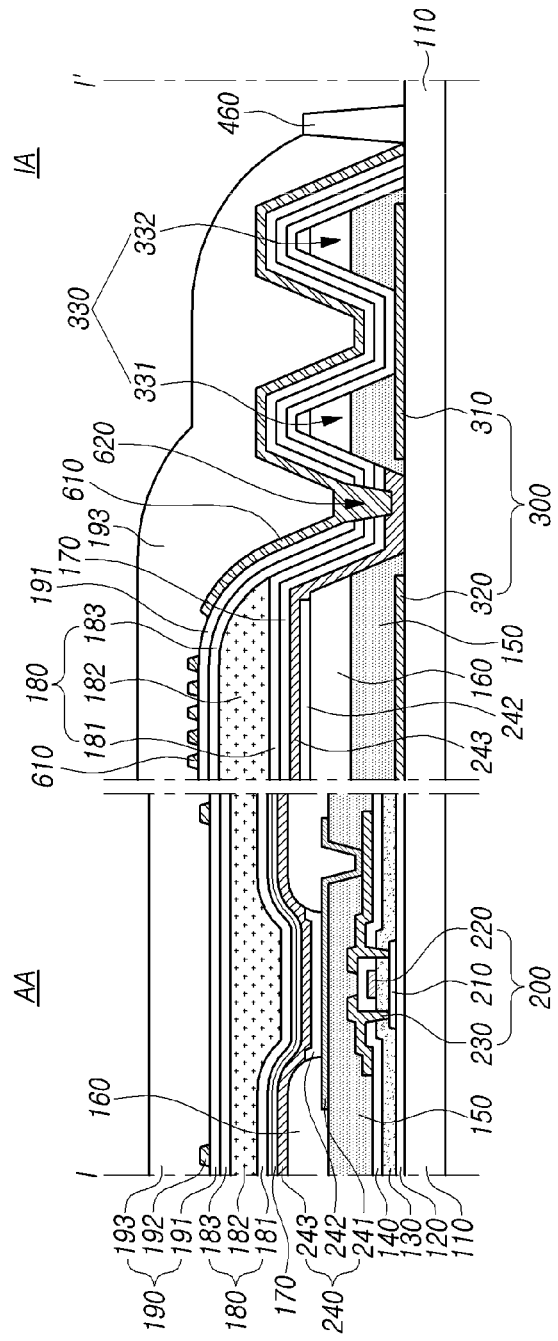
FIG. 2 is a cross-sectional view of an embodiment along the line I-I' of FIG. 1.

FIG. 2 is a first embodiment illustrating a cross section taken along a cutting plane I-I' of FIG. 1. A thin film transistor 200 is disposed in the active area AA of a substrate 110. In addition to the thin film transistor 200, a display device electrically connected to the thin film transistor 200 may also be disposed. FIG. 2 illustrates an organic light emitting device 240 as a display device. Hereinafter, it will be described a case where the display panel 100 according to the embodiment includes the organic light emitting device 240 as a display device. The configuration that the organic light emitting device 240 is electrically connected to the thin film transistor 200 may be understood as an anode electrode 241 included in the organic light emitting device 240 is electrically connected to the thin film transistor 200. Of course, the thin film transistor 200 may also be disposed in an inactive area around the substrate 110. The thin film transistor 200 positioned in the inactive area may be, for example, a gate driver 300 for controlling an electrical signal applied to the active area AA.

The thin film transistor 200 may include a semiconductor layer 210 including amorphous silicon, polycrystalline silicon, or an organic semiconductor material, a gate electrode 220, and a source/drain electrode 230. On the substrate 110, a buffer layer 120 formed of silicon oxide, silicon nitride, or silicon oxynitride may be disposed in order to planarize the surface of the substrate 110 or prevent impurities from penetrating into the semiconductor layer 210, and the semiconductor layer 210 may be positioned on the buffer layer 120.

The gate electrode 220 may be disposed on the semiconductor layer 210. The gate electrode 220 may be formed as a single layer or multiple layers of one or more materials including, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), in consideration of adhesion to adjacent layers, surface flatness of the layer to be stacked, and workability, etc., in this case, in order to secure insulation between the semiconductor layer 210 and the gate electrode 220, the gate insulating layer 130 formed of silicon oxide, silicon nitride, or silicon oxynitride may be interposed between the semiconductor layer 210 and the gate electrode 220. An inorganic insulating layer 140 may be disposed on the gate electrode 220, which may be formed as a single layer or multiple layers of the material of silicon oxide, silicon nitride, or silicon oxynitride.

The Source/drain electrodes 230 are disposed on the inorganic insulating layer 140. The source/drain electrodes 230 are respectively electrically connected to the semiconductor layer 210 through contact holes formed in the inorganic insulating layer 140 and the gate insulating layer 130.

The source/drain electrode 230 may be formed as a single layer or multiple layers of one or more materials including, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), in consideration of conductivity.

To protect the thin film transistor 200 having such a structure, a passivation layer (not shown) covering the thin film transistor 200 may be disposed. The passivation layer may be formed of an inorganic material such as silicon oxide, silicon nitride, or silicon oxynitride. Such a passivation layer may be a single layer or a multilayer.

A planarization layer 150 may be disposed on the passivation layer. For example, in the case that the organic light emitting device is disposed on the thin film transistor 200 as shown in FIG. 2, the planarization layer 150 may serve to substantially planarize the upper portion of the passivation layer covering the thin film transistor 200. The planarization layer 150 may include, for example, a general purpose polymer such as polymethylmethacrylate (PMMA) or polystyrene (PS), a polymer derivative having a phenol group, or organic materials including an acrylic polymer, an imide polymer, arylether-based polymer, amide-based polymer, fluorine-based polymer, p-xylene-based polymer, vinyl alcohol-based polymer and blends thereof, but are not limited thereto. In addition, although the planarization layer 150 is illustrated as a single layer in FIG. 2, various modifications are possible, such as being multilayered. Of course, the display panel 100 according to the present embodiment may have both the passivation layer and the planarization layer 150, or may have only the planarization layer 150 if necessary. The planarization layer 150 may be referred to as a first insulating layer.

In the active area AA of the substrate 110, on the planarization layer 150, there may be disposed an anode electrode 241, a cathode electrode 243, and an organic light emitting stack 242 interposed therebetween and including a light emitting layer. The anode electrode 241, the organic light emitting stack 242, and the cathode electrode 243 may be referred to as the organic light emitting device 240. The definition of the organic light emitting device 240 may be considered because the anode electrode 241, the organic light emitting stack 242, and the cathode electrode 243 is beneficial to be included as one element for emitting light.

The planarization layer 150 has an opening exposing at least one of the source/drain electrodes 230 of the thin film transistor 200. The anode electrode 241 electrically connected to the thin film transistor 200 by contacting any one of the source/drain electrodes 230 through the opening is disposed on the planarization layer 150. The anode electrode 241 may be a (semi)transparent electrode or a reflective electrode. In the case that the anode electrode 241 is a (semi)transparent electrode, it may include, for example, ITO, IZO, ZnO, $In_2O_3$, IGO, or AZO. In the case that the anode electrode 241 is a reflective electrode, it may include a reflective film formed of Ag, Mg, Al, Pt, Pd, Au, Ni, Nd, Ir, Cr, and compounds thereof, and a layer formed of ITO, IZO, ZnO, $In_2O_3$, IGO or AZO. Of course, the present embodiment is not limited thereto, and the anode electrode 241 may include various materials, and its structure may also be modified in various ways, such as a single layer or a multilayer. Although described as an anode electrode in the present embodiment, it may be referred to as a lower electrode, a pixel electrode, or a first electrode.

A bank layer 160 may be disposed on the planarization layer 150. The bank layer 160 may serve to define a pixel by having an opening corresponding to each subpixel, that is, an opening through which at least a central portion of the anode electrode 241 is exposed. In addition, as shown in FIG. 2, the bank layer 160 increases the distance between the edge of the anode electrode 241 and the cathode electrode 243 above the anode electrode 241, thereby preventing arcs from occurring at the edge of the anode electrode 241. The bank layer 160 may be formed of an organic material such as polyimide or hexamethyldisiloxane (HMDSO). The bank layer 160 may be referred to as a second insulating layer or a pixel defining layer.

An intermediate layer of the organic light emitting stack 242 may include a low molecular weight material or high molecular weight material. If a low molecular weight material is included, it may have a structure in which hole injection layer (HIL), a hole transport layer (HTL), an emission layer (EML), an electron transport layer (ETL), an electron injection layer (EIL) are stacked in a single or complex structures. In addition, the organic light emitting stack 242 may include a variety of organic materials such as copper phthalocyanine (CuPc), N,N'-Di(naphthalene-1-yl)-N,N'-diphenyl-benzidine (NPB), tris-8-hydroxyquinoline aluminum (Alq3), etc. These layers can be formed by the method of vacuum evaporation.

In the case that the intermediate layer includes a high molecular weight material, it may have a structure including a hole transport layer (HTL) and a light emitting layer (EML). In this case, the hole transport layer may include PEDOT, and the emission layer may include a polymer material such as poly-phenylenevinylene (PPV) and polyfluorene. Such an intermediate layer may be formed by screen printing, inkjet printing, laser induced thermal imaging (LITI), or the like.

The intermediate layer is not necessarily limited thereto, and may have various structures.

The cathode electrode 243 is disposed above the active area AA, and may be disposed to cover the active area AA as illustrated in FIG. 2. That is, the cathode electrode 243 may be integrally formed in a plurality of organic light emitting devices to correspond to the plurality of anode electrodes 241. The cathode electrode 243 may be a (semi)transparent electrode or a reflective electrode.

In the case that the cathode electrode 243 is a (semi)transparent electrode, it may include a layer formed of a metal having a small work function, that is, Li, Ca, LiF/Ca, LiF/Al, Al, Ag, Mg, or a compound thereof, and a (semi)transparent conductive layer of such as ITO, IZO, ZnO or In2O3. In the case that the cathode electrode 243 is a reflective electrode, it may have a layer formed of Li, Ca, LiF/Ca, LiF/Al, Al, Ag, Mg, and compounds thereof. Of course, the configuration and material of the cathode electrode 243 are not limited thereto, and various modifications are possible.

A capping layer 170 may be disposed on the cathode electrode 243 to protect the organic light emitting device 240 and to allow the light generated from the organic light emitting device 240 to be well transmitted to the top.

An encapsulation layer 180 for protecting the organic light emitting device 240 from external oxygen or moisture may be disposed on the capping layer 170. The encapsulation layer 180 may include a first inorganic insulating layer 181, an organic insulating layer 182, and a second inorganic insulating layer 183. The encapsulation layer 180 may have an inclined surface at the periphery.

A touch unit 190 for recognizing a user's touch may be disposed on the encapsulation layer 180. The touch unit 190 may include a lower touch insulating layer 191, a touch electrode 192, and an upper touch insulating layer 193. In one or more embodiments, the touch unit 190 includes a touch circuit 190 and may be referred to as a touch circuit 190.

The organic light emitting device 240 includes a cathode electrode 243, and it is beneficial for a preset electrical signal to be applied to the cathode electrode 243 in order to display an image. In general, a set reference voltage or a signal for grounding may be applied. Accordingly, a low-potential power line 410 may be positioned in the inactive area to transmit a preset electric signal to the cathode electrode 243. Although referred to as the cathode electrode 243 in the present embodiment, it may also be referred to as a cathode, an opposite electrode, an upper electrode, and a second electrode.

FIG. 2 illustrates a cross-section of the inactive area IA disposed on the side of the active area AA along the cutting line I-I' of FIG. 1. In the inactive area IA, a gate driver (GIP) 300, a moisture permeation prevention structure 330, a crack stopper structure 460, and the like may be arranged in an order adjacent to the active area AA. The moisture permeation prevention structure 330 may include a first moisture permeation prevention structure 331 and a second moisture permeation prevention structure 332. The gate driver 300 may include a light emission signal driver 310, a scan signal driver 320, and a link unit (not shown). The circuit configuration may vary according to the configuration of the organic light emitting device, and the gate driver 300 may transmit at least one light emission control signal and at least one scan control signal to a subpixel of the organic light emitting device. For such signal transmission, a link unit may be disposed between the light emission signal driver 310 and the scan signal driver 320, and the organic light emitting device. The light emission signal driver 310 and the scan signal driver 320 may include a plurality of transistors and at least one capacitor. On the gate driver 300, the planarization layer 150 and the bank layer 160 may be disposed extending from the active area AA, and the organic light emitting stack 242 may be extended and disposed in at least a portion of the area.

Referring to FIG. 2, the gate driver 300 may be divided into the light emission signal driver 310 and the scan signal driver 320. For example, the light emission signal driver 310 may be disposed outside the scan signal driver 320. However, the positions of the light emission signal driver 310 and the scan signal driver 320 are not limited thereto. In order to prevent the penetration of moisture from the outside into the space between the light emission signal driver 310 and the scan signal driver 320, there may be formed a disconnection structure for disconnecting part of the planarization layer 150 and the bank layer 160, which are main paths. For example, the planarization layer 150 and the bank layer 160 are etched, so that a hole is formed to expose the passivation layer (not shown) covering the gate driver 300 or the inorganic insulating layer 140 or the gate insulating layer 130 included in the gate driver 300. Accordingly, external moisture that has moved through the planarization layer 150 and the bank layer 160 may not further move at the etched portion.

A moisture permeation prevention structure 330 may be disposed due to the structure in which the planarization layer 150 and the bank layer 160 are disconnected and separated at the extended ends. The moisture permeation prevention structure 330 may include a first moisture permeation prevention structure 331 and a second moisture permeation prevention structure 332, and may be arranged in order based on the active area AA. The moisture permeation prevention structure 330 may be formed of the same material as the planarization layer 150 and the bank layer 160 extending from the active area AA. The cathode electrode 243 may be disposed to extend from the active area AA on the hole formed in this way.

Referring to FIG. 2, the cathode electrode 243 may extend to the moisture permeation prevention structure 330, specifically, may extend to the side of the first moisture permeation prevention structure 331. The cathode electrode 243 may extend to a hole region formed by etching the planarization layer 150 and the bank layer 160 described above and may be disposed to contact a side surface of the first moisture permeation prevention structure 331. The capping layer 170 may extend on the cathode electrode 243, and the region where the capping layer 170 extends may be the same as or adjacent to the cathode electrode 243 and may be located on the side of the first moisture permeation prevention structure 331. The encapsulation layer 180 on the capping layer 170 may also extend from the active area AA and be located adjacent to the crack stopper structure 460 beyond the second moisture permeation prevention structure 332. However, the organic insulating layer 182 of the encapsulation layer 180 may be removed so as not to contact the side surface of the first moisture permeation prevention structure 331. The encapsulation layer 180 may be disposed so as not to contact the crack stopper structure 460 because of the characteristics including the first inorganic insulating layer 181 and the second inorganic insulating layer 183. Cracks generated in the substrate 110 in the scribing process of the display panel 100 may reach the crack stopper structure 460, and at this time, the crack stopper structure 460 may absorb a kind of impact. If the encapsulation layer 180 is disposed to contact the crack stopper structure 460, cracks may propagate through the first inorganic insulating layer 181 or the second inorganic insulating layer 183 included in the encapsulation layer 180. In order to prevent this, the crack stopper structure 460 and the encapsulation layer 180 may be arranged to be spaced apart by a predetermined distance or a selected distance.

A portion of the touch unit 190 disposed on the encapsulation layer 180 may extend and be disposed to the moisture permeation prevention structure 330. The lower touch insulating layer 191 included in the touch unit 190, the contact electrode 610 disposed of the same material as the touch electrode 192, and the upper touch insulating layer 193 may extend from the active area AA and may be disposed on the moisture permeation prevention structure 330. The contact electrode 610 may be formed of the same material as the touch electrode 192, but may be electrically disconnected and connected to the low-potential power line 410. For example, the contact electrode 610 may descend along an inclined surface of the encapsulation layer 180 and extend to the outer periphery of the substrate 110.

In a region adjacent to one side of the first moisture permeation prevention structure 331, it may be formed a first contact hole 620 exposing the upper surface of the cathode electrode 243 by etching the capping layer 170, the first inorganic insulating layer 181 and the second inorganic insulating layer 183 of the encapsulation layer 180.

A contact electrode 610 may be electrically connected to the cathode electrode 243 through the first contact hole 620. A base voltage for driving the organic light emitting device 240, so-called ground power, may be supplied through the electrical connection between the cathode electrode 243 and the contact electrode 610.

The upper touch insulating layer 193 may extend to a region where the crack stopper structure 460 is located so as to sufficiently cover the lower touch insulating layer 191 and the contact electrode 610. The upper touch insulating layer 193 may cover one side wall of the crack stopper structure 460, and may serve to absorb oxygen, moisture, and cracks that may be introduced from the outside.

The connection structure between the contact electrode 610 and the cathode electrode 243 can reduce space constraints compared to the source/drain electrode used for the conventional low-potential power line 410. In the case that the low-potential power line 410 is formed using the same material as the material used for the gate driver 300, it is beneficial for the source/drain electrodes to be disposed on the outer periphery of the gate driver 300 so as not to overlap with the gate driver 300, thereby enlarging the inactive area IA. In addition, in order to connect the cathode electrode 243 and the low-potential power line 410 formed of the source/drain electrode, it is beneficial to have a separate intermediate electrode formed of the same process and the same material as the anode electrode 241. A point connecting the intermediate electrode and the low-potential power line 410 may be disposed outside the gate driver 300. The so-called connection structure between the cathode electrode 243 and the intermediate electrode and the low-potential power line 410 occupies a lot of space in the inactive area IA, and enlargement of the inactive area IA leads to an enlargement of the bezel area, so that the aesthetic sense to the user may be deteriorated.

In the case of the contact electrode 610, since the contact electrode 610 is formed of the same process and the same material as the touch electrode disposed on the organic light emitting device 240, it may be disposed to overlap the gate driver 300 outside the inactive area IA. In addition, since both the contact electrode 610 and the cathode electrode 243 are disposed above the gate driver 300, the connection structure is simple so that a direct connection structure that does not require a separate intermediate electrode is possible.

Referring to FIG. 2, the contact electrode 610 and the cathode electrode 243 may be electrically connected through the first contact hole 620 disposed adjacent to one side of the first moisture permeation prevention structure 331 close to the active area AA. By arranging the first contact hole 620 in the closest position to the cathode electrode 243, it is possible to compensate the resistance of the cathode electrode 243 having a relatively high electrical resistance. The cathode electrode 243 is formed to be very thin, about 100 to 200 Å, and may have higher electrical resistance than other metal lines. The position of the first contact hole 620 in FIG. 2 may be applied in the case that the organic insulating layer 182 of the encapsulation layer 180 can be controlled so as not to exceed the first moisture permeation prevention structure 331.

Figure 3:
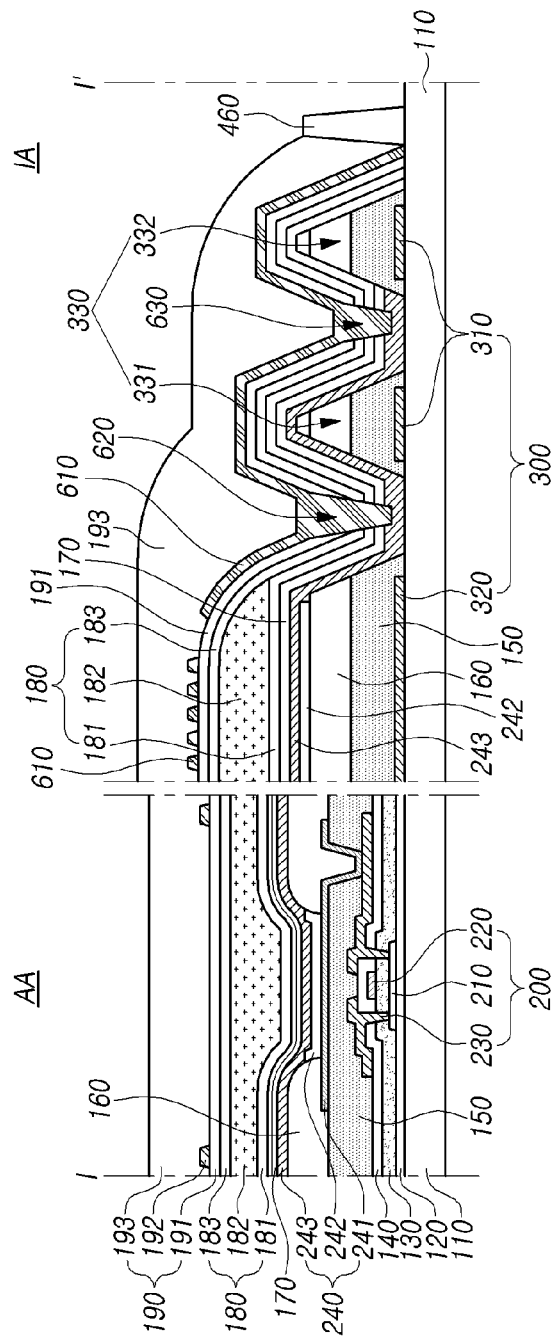
FIG. 3 is a cross-sectional view of another embodiment along the line I-I' of FIG. 1.

FIG. 3 illustrates another example of a cross section of the inactive area IA disposed on the side of the active area AA along the cutting line I-I' of FIG. 1.

Referring to FIG. 3, a thin film transistor 200 may be disposed in the active area AA of a substrate 110 and the organic light emitting device 240 may also be disposed. The description of the active area AA of FIG. 3 is the same as the structure of FIG. 2 and thus will be omitted.

A cross section of the inactive area IA disposed on the side of the active area AA can be seen along the cutting line I-I' of FIG. 1. In the inactive area IA, a gate driver (GIP) 300, a moisture permeation prevention structure 330, a crack stopper structure 460, and the like may be arranged in an order adjacent to the active area AA. The moisture permeation prevention structure 330 may include a first moisture permeation prevention structure 331 and a second moisture permeation prevention structure 332. The gate driver 300 may include an light emission signal driver 310, a scan signal driver 320, and a link unit (not shown). The circuit configuration may vary according to the configuration of the organic light emitting device, and the gate driver 300 may transmit at least one light emission control signal and at least one scan control signal to a subpixel of the organic light emitting device. For such signal transmission, a link unit may be disposed between the light emission signal driver 310 and the scan signal driver 320 and the organic light emitting device. The light emission signal driver 310 and the scan signal driver 320 may include a plurality of transistors and at least one capacitor. On the gate driver 300, a planarization layer 150 and a bank layer 160 may be disposed while extending from the active area AA, and an organic light emitting stack 242 may be extended and disposed in at least a portion of the area.

Referring to FIG. 3, the gate driver 300 may be divided into the light emission signal driver 310 and the scan signal driver 320. For example, the light emission signal driver 310 may be disposed outside the scan signal driver 320. However, the positions of the light emission signal driver 310 and the scan signal driver 320 are not limited thereto. In order to prevent the penetration of moisture from the outside into the space between the light emission signal driver 310 and the scan signal driver 320, there may be formed a disconnection structure for disconnecting part of the planarization layer 150 and the bank layer 160, which are main paths. For example, the planarization layer 150 and the bank layer 160 are etched, so that a hole is formed to expose the passivation layer (not shown) covering the gate driver 300 or the inorganic insulating layer 140 or the gate insulating layer 130 included in the gate driver 300. Accordingly, external moisture that has moved through the planarization layer 150 and the bank layer 160 may not further move at the etched portion.

A moisture permeation prevention structure 330 may be disposed due to the structure in which the planarization layer 150 and the bank layer 160 are disconnected and separated at the extended ends. The moisture permeation prevention structure 330 may include a first moisture permeation prevention structure 331 and a second moisture permeation prevention structure 332, and may be arranged in order based on the active area AA. The moisture permeation prevention structure 330 may be formed of the same material as the planarization layer 150 and the bank layer 160 extending from the active area AA. The cathode electrode 243 may be disposed to extend from the active area AA on the hole formed in this way.

Referring to FIG. 3, the cathode electrode 243 may extend to the moisture permeation prevention structure 330, specifically, may extend between the first moisture permeation prevention structure 331 and the second moisture permeation prevention structure 332. The cathode electrode 243 may extend to a hole region formed by etching the planarization layer 150 and the bank layer 160 described above and may be disposed to contact both sides and the upper surface of the first moisture permeation prevention structure 331 and a side surface of the second moisture permeation prevention structure 332. The capping layer 170 may extend on the cathode electrode 243, and the region where the capping layer 170 extends may be the same as or adjacent to the cathode electrode 243 and may be located on the side of the second moisture permeation prevention structure 332. The encapsulation layer 180 on the capping layer 170 may also extend from the active area AA and be located adjacent to the crack stopper structure 460 beyond the second moisture permeation prevention structure 332. However, the organic insulating layer 182 of the encapsulation layer 180 may be removed so as not to contact the side surface of the first moisture permeation prevention structure 331. The encapsulation layer 180 may be disposed so as not to contact the crack stopper structure 460 because of the characteristics including the first inorganic insulating layer 181 and the second inorganic insulating layer 183. Cracks generated in the substrate 110 in the scribing process of the display panel 100 may reach the crack stopper structure 460, and at this time, the crack stopper structure 460 may absorb a kind of impact. If the encapsulation layer 180 is disposed to contact the crack stopper structure 460, cracks may propagate through the first inorganic insulating layer 181 or the second inorganic insulating layer 183 included in the encapsulation layer 180. In order to prevent this, the crack stopper structure 460 and the encapsulation layer 180 may be arranged to be spaced apart by a predetermined distance or a selected distance.

A portion of the touch unit 190 disposed on the encapsulation layer 180 may extend and be disposed to the moisture permeation prevention structure 330. The lower touch insulating layer 191 included in the touch unit 190, the contact electrode 610 disposed of the same material as the touch electrode 192, and the upper touch insulating layer 193 may extend from the active area AA and may be disposed on the moisture permeation prevention structure 330. The contact electrode 610 may be formed of the same material as the touch electrode 192, but may be electrically disconnected and connected to the low-potential power line 410.

At one side of the first moisture permeation prevention structure 331 and between the first moisture permeation prevention structure 331 and the second moisture permeation prevention structure 332, it may be formed a first contact hole 620 and a second contact hole 630 exposing the upper surface of the cathode electrode by etching the capping layer 170, the first inorganic insulating layer 181 and the second inorganic insulating layer 183 of the encapsulation layer 180.

A contact electrode 610 may be electrically connected to the cathode electrode 243 through the first contact hole 620 and the second contact hole 630. A base voltage for driving the organic light emitting device 240, so-called ground power, may be supplied through the electrical connection between the cathode electrode 243 and the contact electrode 610.

The upper touch insulating layer 193 may extend to a region where the crack stopper structure 460 is located so as to sufficiently cover the lower touch insulating layer 191 and the contact electrode 610. The upper touch insulating layer 193 may cover one side wall of the crack stopper structure 460, and may serve to absorb oxygen, moisture, and cracks that may be introduced from the outside.

The connection structure between the contact electrode 610 and the cathode electrode 243 can reduce space constraints compared to the source/drain electrode used for the conventional low-potential power line 410. In the case that the low-potential power line 410 is formed using the same material as the material used for the gate driver 300, it is beneficial for the source/drain electrodes 230 to be disposed on the outer periphery of the gate driver 300 so as not to overlap with the gate driver 300, thereby enlarging the inactive area IA. In addition, in order to connect the cathode electrode 243 and the low-potential power line 410 formed of the source/drain electrode, it is beneficial to have a separate intermediate electrode formed of the same process and the same material as the anode electrode 241. A point connecting the intermediate electrode and the low-potential power line 410 may be disposed outside the gate driver 300. The connection structure between the cathode electrode 243 and the intermediate electrode and the low-potential power line 410 occupies a lot of space in the inactive area IA, and enlargement of the inactive area IA leads to an enlargement of the bezel area, so that the aesthetic sense to the user may be deteriorated.

In the case of the contact electrode 610, since the contact electrode 610 is formed of the same process and the same material as the touch electrode disposed on the organic light emitting device 240, it may be disposed to overlap the gate driver 300 outside the inactive area IA. In addition, since both the contact electrode 610 and the cathode electrode 243 are disposed above the gate driver 300, the connection structure is simple so that a direct connection structure that does not require a separate intermediate electrode is possible.

Referring to FIG. 3, if the contact electrode 610 is connected to the cathode electrode 243 through the first contact hole 620 and the second contact hole 630, the connection between the two lines may be more reliable and the electrical resistance may be lowered due to the thickening of the lines. The cathode electrode 243 is formed to be very thin, about 100 to 200 Å, and may have higher electrical resistance than other metal lines. However, the resistance may be lowered since the connection through the first contact hole 620 and the second contact hole 630 enables two lines to become one line having a wide width. In addition, it is possible to be more robust against external moisture permeation caused by a trimming surface of the substrate at the outermost part of the inactive area or a crack in the trimming surface of the substrate. The location of the first contact hole 620 and the second contact hole 630 of FIG. 3 may provide an advantage of being able to be connected through the second contact hole 630 even if the organic insulating layer 182 of the encapsulation layer 180 exceeds the first moisture permeation prevention structure 331.

Figure 4:
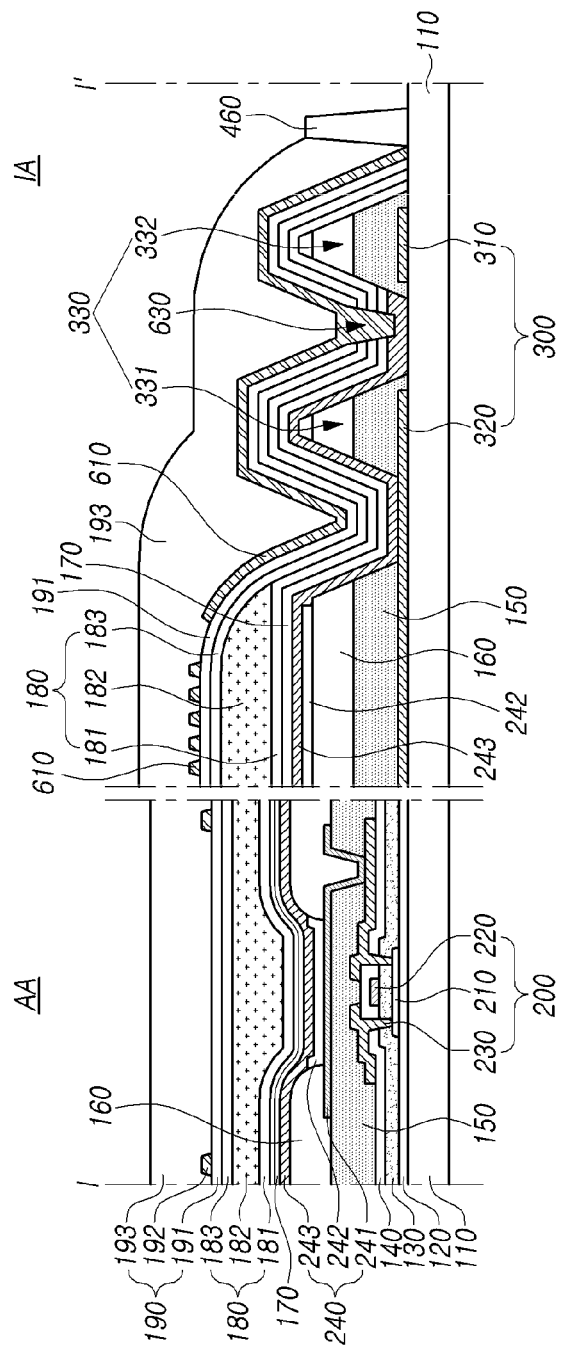
FIG. 4 is a cross-sectional view of another embodiment along the line I-I' of FIG. 1.

FIG. 4 illustrates another example of a cross section of the inactive area IA disposed on the side of the active area AA along the cutting line I-I' of FIG. 1.

Referring to FIG. 4, a thin film transistor 200 may be disposed in the active area AA of a substrate 110 and the organic light emitting device 240 may also be disposed. The description of the active area AA of FIG. 4 is the same as the structure of FIG. 2 and thus will be omitted.

A cross section of the inactive area IA disposed on the side of the active area AA can be seen along the cutting line I-I' of FIG. 1. In the inactive area IA, a gate driver (GIP) 300, a moisture permeation prevention structure 330, a crack stopper structure 460, and the like may be arranged in an order adjacent to the active area AA. The moisture permeation prevention structure 330 may include a first moisture permeation prevention structure 331 and a second moisture permeation prevention structure 332. The gate driver 300 may include an light emission signal driver 310, a scan signal driver 320, and a link unit (not shown). The circuit configuration may vary according to the configuration of the organic light emitting device, and the gate driver 300 may transmit at least one light emission control signal and at least one scan control signal to a subpixel of the organic light emitting device. For such signal transmission, a link unit may be disposed between the light emission signal driver 310 and the scan signal driver 320 and the organic light emitting device. The light emission signal driver 310 and the scan signal driver 320 may include a plurality of transistors and at least one capacitor. On the gate driver 300, a planarization layer 150 and a bank layer 160 may be disposed while extending from the active area AA, and an organic light emitting stack 242 may be extended and disposed in at least a portion of the area.

Referring to FIG. 4, the gate driver 300 may be divided into the light emission signal driver 310 and the scan signal driver 320. For example, the light emission signal driver 310 may be disposed outside the scan signal driver 320. However, the positions of the light emission signal driver 310 and the scan signal driver 320 are not limited thereto. In order to prevent the penetration of moisture from the outside into the space between the light emission signal driver 310 and the scan signal driver 320, there may be formed a disconnection structure for disconnecting part of the planarization layer 150 and the bank layer 160, which are main paths. For example, the planarization layer 150 and the bank layer 160 are etched, so that a hole is formed to expose the passivation layer (not shown) covering the gate driver 300 or the inorganic insulating layer 140 or the gate insulating layer 130 included in the gate driver 300. Accordingly, external moisture that has moved through the planarization layer 150 and the bank layer 160 may not further move at the etched portion.

A moisture permeation prevention structure 330 may be disposed due to the structure in which the planarization layer 150 and the bank layer 160 are disconnected and separated at the extended ends. The moisture permeation prevention structure 330 may include a first moisture permeation prevention structure 331 and a second moisture permeation prevention structure 332, and may be arranged in order based on the active area AA. The moisture permeation prevention structure 330 may be formed of the same material as the planarization layer 150 and the bank layer 160 extending from the active area AA. The cathode electrode 243 may be disposed to extend from the active area AA on the hole formed in this way.

Referring to FIG. 4, the cathode electrode 243 may extend to the moisture permeation prevention structure 330, specifically, may extend to the side surface of the first moisture permeation prevention structure 331. The cathode electrode 243 may extend to a hole region formed by etching the planarization layer 150 and the bank layer 160 described above and may be disposed to contact both sides and the upper surface of the first moisture permeation prevention structure 331 and a side surface of the second moisture permeation prevention structure 332. The capping layer 170 may extend on the cathode electrode 243, and the region where the capping layer 170 extends may be the same as or adjacent to the cathode electrode 243 and may be located on the side of the second moisture permeation prevention structure 332. The encapsulation layer 180 on the capping layer 170 may also extend from the active area AA and be located adjacent to the crack stopper structure 460 beyond the second moisture permeation prevention structure 332. However, the organic insulating layer 182 of the encapsulation layer 180 may be removed so as not to contact the side surface of the first moisture permeation prevention structure 331. The encapsulation layer 180 may be disposed so as not to contact the crack stopper structure 460 because of the characteristics including the first inorganic insulating layer 181 and the second inorganic insulating layer 183. Cracks generated in the substrate 110 in the scribing process of the display panel 100 may reach the crack stopper structure 460, and at this time, the crack stopper structure 460 may absorb a kind of impact. If the encapsulation layer 180 is disposed to contact the crack stopper structure 460, cracks may propagate through the first inorganic insulating layer 181 or the second inorganic insulating layer 183 included in the encapsulation layer 180. In order to prevent this, the crack stopper structure 460 and the encapsulation layer 180 may be arranged to be spaced apart by a predetermined distance or a selected distance.

A portion of the touch unit 190 disposed on the encapsulation layer 180 may extend and be disposed to the moisture permeation prevention structure 330. The lower touch insulating layer 191 included in the touch unit 190, the contact electrode 610 disposed of the same material as the touch electrode 192, and the upper touch insulating layer 193 may extend from the active area AA and may be disposed on the moisture permeation prevention structure 330. The contact electrode 610 may be formed of the same material as the touch electrode 192, but may be electrically disconnected and connected to the low-potential power line 410.

In a region adjacent to one side of the first moisture permeation prevention structure 331, it may be formed a second contact hole 630 exposing the upper surface of the cathode electrode by etching the capping layer 170, the first inorganic insulating layer 181 and the second inorganic insulating layer 183 of the encapsulation layer 180.

A contact electrode 610 may be electrically connected to the cathode electrode 243 through the second contact hole 630. A base voltage for driving the organic light emitting device 240, so-called ground power, may be supplied through the electrical connection between the cathode electrode 243 and the contact electrode 610.

The upper touch insulating layer 193 may extend to a region where the crack stopper structure 460 is located so as to sufficiently cover the lower touch insulating layer 191 and the contact electrode 610. The upper touch insulating layer 193 may cover one side wall of the crack stopper structure 460, and may serve to absorb oxygen, moisture, and cracks that may be introduced from the outside.

The connection structure between the contact electrode 610 and the cathode electrode 243 can reduce space constraints compared to the source/drain electrode used for the conventional low-potential power line 410. In the case that the low-potential power line 410 is formed using the same material as the material used for the gate driver 300, it is beneficial for the source/drain electrodes to be disposed on separately allocated space on the outer periphery of the gate driver 300 so as not to overlap with the gate driver 300, thereby enlarging the inactive area IA. In addition, in order to connect the cathode electrode 243 and the low-potential power line 410 formed of the source/drain electrode, it is beneficial to have a separate intermediate electrode formed of the same process and the same material as the anode electrode 241. A point connecting the intermediate electrode and the low-potential power line 410 may be disposed outside the gate driver 300. The connection structure between the cathode electrode 243 and the intermediate electrode and the low-potential power line 410 occupies a lot of space in the inactive area IA, and enlargement of the inactive area IA leads to an enlargement of the bezel area, so that the aesthetic sense to the user may be deteriorated.

In the case of the contact electrode 610, since the contact electrode 610 is formed of the same process and the same material as the touch electrode disposed on the organic light emitting device 240, it may be disposed to overlap the gate driver 300 outside the inactive area IA. In addition, since both the contact electrode 610 and the cathode electrode 243 are disposed above the gate driver 300, the connection structure is simple so that a direct connection structure that does not require a separate intermediate electrode is possible.

Referring to FIG. 4, the contact electrode 610 and the cathode electrode 243 may be electrically connected through the second contact hole 630 disposed adjacent to one side of the second moisture permeation prevention structure 332. By arranging the second contact hole 630 between the first moisture permeation preventing structure 331 and the second moisture permeation preventing structure 332, even if the organic insulating layer 182 of the encapsulation layer 180 is close to the first moisture permeation prevention structure 331, the cathode electrode 243 and the contact electrode 610 can be electrically connected.

Figure 5:
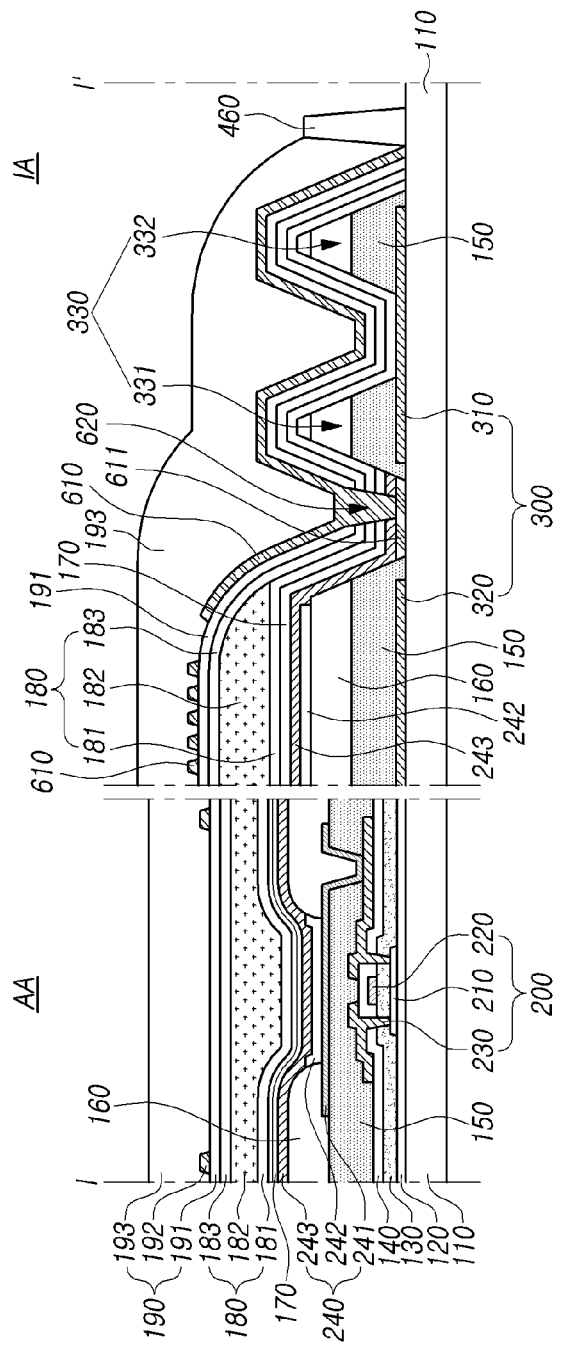
FIG. 5 is a cross-sectional view of another embodiment along the line I-I' of FIG. 1.

FIG. 5 illustrates another example of a cross section of the inactive area IA disposed on the side of the active area AA along the cutting line I-I' of FIG. 1.

Referring to FIG. 5, a thin film transistor 200 may be disposed in the active area AA of a substrate 110 and the organic light emitting device 240 may also be disposed. The description of the active area AA of FIG. 5 is the same as the structure of FIG. 2 and thus will be omitted.

A cross section of the inactive area IA disposed on the side of the active area AA can be seen along the cutting line I-I' of FIG. 1. In the inactive area IA, a gate driver (GIP) 300, a moisture permeation prevention structure 330, a crack stopper structure 460, and the like may be arranged in an order adjacent to the active area AA. The moisture permeation prevention structure 330 may include a first moisture permeation prevention structure 331 and a second moisture permeation prevention structure 332. The gate driver 300 may include an light emission signal driver 310, a scan signal driver 320, and a link unit (not shown). The circuit configuration may vary according to the configuration of the organic light emitting device, and the gate driver 300 may transmit at least one light emission control signal and at least one scan control signal to a subpixel of the organic light emitting device. For such signal transmission, a link unit may be disposed between the light emission signal driver 310 and the scan signal driver 320 and the organic light emitting device. The light emission signal driver 310 and the scan signal driver 320 may include a plurality of transistors and at least one capacitor. A second contact electrode 611 may be disposed between the light emission signal driver 310 and the scan signal driver 320. On the gate driver 300, a planarization layer 150 and a bank layer 160 may be disposed while extending from the active area AA, and an organic light emitting stack 242 may be extended and disposed in at least a portion of the area.

Referring to FIG. 5, the gate driver 300 may be divided into the light emission signal driver 310 and the scan signal driver 320. For example, the light emission signal driver 310 may be disposed outside the scan signal driver 320. However, the positions of the light emission signal driver 310 and the scan signal driver 320 are not limited thereto. In order to prevent the penetration of moisture from the outside into the space between the light emission signal driver 310 and the scan signal driver 320, there may be formed a disconnection structure for disconnecting part of the planarization layer 150 and the bank layer 160, which are main paths. For example, the planarization layer 150 and the bank layer 160 are etched, so that a hole is formed to expose the second contact electrode 611 disposed between the light emission signal driver 310 and the scan signal driver 320. Accordingly, external moisture that has moved through the planarization layer 150 and the bank layer 160 may not further move at the etched portion.

A moisture permeation prevention structure 330 may be disposed due to the structure in which the planarization layer 150 and the bank layer 160 are disconnected and separated at the extended ends. The moisture permeation prevention structure 330 may include a first moisture permeation prevention structure 331 and a second moisture permeation prevention structure 332, and may be arranged in order based on the active area AA. The moisture permeation prevention structure 330 may be formed of the same material as the planarization layer 150 and the bank layer 160 extending from the active area AA. The cathode electrode 243 may be disposed to extend from the active area AA on the hole formed in this way.

Referring to FIG. 5, the cathode electrode 243 may extend to the moisture permeation prevention structure 330, specifically, the cathode electrode 243 may extend to the upper surface of the second contact electrode 611 exposed by etching the planarization layer 150 and the bank layer 160 and may be disposed to contact the side surface of the first moisture permeation prevention structure 331. A capping layer 170 may extend on the cathode electrode 243, and the region where the capping layer 170 extends may be the same as or adjacent to the cathode electrode 243 and may be located on the side of the first moisture permeation prevention structure 331. The encapsulation layer 180 on the capping layer 170 may also extend from the active area AA and be located adjacent to the crack stopper structure 460 beyond the second moisture permeation prevention structure 332. However, the organic insulating layer 182 of the encapsulation layer 180 may be removed so as not to contact the side surface of the first moisture permeation prevention structure 331. The encapsulation layer 180 may be disposed so as not to contact the crack stopper structure 460 because of the characteristics including the first inorganic insulating layer 181 and the second inorganic insulating layer 183. Cracks generated in the substrate 110 in the scribing process of the display panel 100 may reach the crack stopper structure 460, and at this time, the crack stopper structure 460 may absorb a kind of impact. If the encapsulation layer 180 is disposed to contact the crack stopper structure 460, cracks may propagate through the first inorganic insulating layer 181 or the second inorganic insulating layer 183 included in the encapsulation layer 180. In order to prevent this, the crack stopper structure 460 and the encapsulation layer 180 may be arranged to be spaced apart by a predetermined distance or a selected distance.

A portion of the touch unit 190 disposed on the encapsulation layer 180 may extend and be disposed to the moisture permeation prevention structure 330. The lower touch insulating layer 191 included in the touch unit 190, the contact electrode 610 disposed of the same material as the touch electrode 192, and the upper touch insulating layer 193 may extend from the active area AA and may be disposed on the moisture permeation prevention structure 330. The contact electrode 610 may be formed of the same material as the touch electrode 192, but may be electrically disconnected and connected to the low-potential power line 410.

In a region adjacent to one side of the first moisture permeation prevention structure 331, it may be formed a first contact hole 620 exposing the upper surface of the cathode electrode by etching the capping layer 170, the first inorganic insulating layer 181 and the second inorganic insulating layer 183 of the encapsulation layer 180.

A contact electrode 610 may be electrically connected to the cathode electrode 243 and the second contact electrode 611 under the cathode electrode 243 through the first contact hole 620. A base voltage for driving the organic light emitting device 240, so-called ground power, may be supplied through the electrical connection between the cathode electrode 243 and the contact electrode 610.

The upper touch insulating layer 193 may extend to a region where the crack stopper structure 460 is located so as to sufficiently cover the lower touch insulating layer 191 and the contact electrode 610. The upper touch insulating layer 193 may cover one side wall of the crack stopper structure 460, and may serve to absorb oxygen, moisture, and cracks that may be introduced from the outside.

The connection structure between the contact electrode 610 and the cathode electrode 243 and the second contact electrode 611 can reduce the electrical resistance of the low-potential power supply while reducing space constraints compared to the source/drain electrode used as the low-potential power line 410. The source/drain electrode constituting the second contact electrode 611 may be made of a material used for the gate driver 300, that is, a material having a relatively low electrical resistance. Even if the second contact electrode 611 is disposed only in a small area between the light emission signal driver 310 and the scan signal driver 320, the electrical resistance of the low potential power line 410 may be reduced. That is, by disposing the second contact electrode 611 between the light emission signal driving unit 310 and the scan signal driving unit 320, the inactive area IA is slightly stretched compared to other embodiments, but electrical characteristics may be improved. Since a separate space is beneficial to be allocated to the outside of the gate driver 300 so as not to overlap with the gate driver 300 in order to form the low-potential power line 410, thereby enlarging the inactive area IA. In addition, in order to connect the cathode electrode 243 and the low-potential power line 410 formed of the source/drain electrode, it is beneficial to have a separate intermediate electrode formed of the same process and the same material as the anode electrode 241. A point connecting the intermediate electrode and the low-potential power line 410 may be disposed outside the gate driver 300. The connection structure between the cathode electrode 243 and the intermediate electrode and the low-potential power line 410 occupies a lot of space in the inactive area IA, and enlargement of the inactive area IA leads to an enlargement of the bezel area, so that the aesthetic sense to the user may be deteriorated.

In the case of the contact electrode 610, since the contact electrode 610 is formed of the same process and the same material as the touch electrode disposed on the organic light emitting device 240, it may be disposed to overlap the gate driver 300 outside the inactive area IA. In addition, since both the contact electrode 610 and the cathode electrode 243 are disposed above the gate driver 300, the connection structure is simple so that a direct connection structure that does not require a separate intermediate electrode is possible.

Referring to FIG. 5, the contact electrode 610 and the cathode electrode 243 may be electrically connected through the first contact hole 620 disposed adjacent to one side of the first moisture permeation prevention structure 331 close to the active area AA. By arranging the first contact hole 620 in the closest position to the cathode electrode 243 and adding the second contact electrode 611, it is possible to compensate for the resistance of the cathode electrode 243 having a relatively high electrical resistance. The cathode electrode 243 is formed to be very thin, about 100 to 200 Å, and may have higher electrical resistance than other metal lines.

In the same manner as in an embodiment described in FIG. 2 to FIG. 5, the first contact hole 620, the second contact hole 630, the first moisture permeation prevention structure 331 and the second moisture permeation prevention structure 332 constituting the moisture-permeable structure 330 may be disposed on at least three sides of the inactive area surrounding the active area AA in FIG. 1.

It will be briefly described below the "electrical connection (electrical contact) structure between the contact electrode 610 and the cathode electrode 243" described above with reference to FIGS. 2 to 5.

Referring to FIG. 2 to FIG. 5, the display panel 100 may include a planarization layer 150 disposed on the substrate 110 and disposed in the active area AA and the inactive area IA, and a first moisture permeation preventing structure 331 and a second moisture permeation preventing structure 332 disposed on the outer side of the encapsulation layer 180 and positioned on the planarization layer 150 in the inactive area IA.

Each of the first moisture permeation preventing structure 331 and the second moisture permeation preventing structure 332 may include a moisture anti-permeable material layer disposed on the planarization layer 150. Here, for example, the moisture anti-permeable material layer may be made of the same material as the bank layer 160 positioned on the planarization layer 150 or made of a different material.

Each of the first moisture permeation preventing structure 331 and the second moisture permeation preventing structure 332 may include only a moisture anti-permeable material layer, but may also be a multi-layered structure further including a planarization layer 150 and the like.

Referring to FIG. 2 to FIG. 5, the planarization layer 150 may be open between the active area AA and the first moisture permeation prevention structure 331, and may be open between the first moisture permeation prevention structure 331 and the second moisture permeation prevention structure 332. The term "open" used here may refer to a state of being isolated, disconnected, or spaced apart according to the relevant embodiment and the descriptions associated with that embodiment. Further meaning can be included in the term "open" and a person of ordinary skill in the art would readily appreciate the meaning of the term based on the embodiments shown in FIGS. 2 to 5. For example, in FIG. 2, the planarization layer 150 is not a continuous piece as it is disconnected in the inactive area where the cathode electrode 243 contacts the substrate 110. As a result, a piece of the planarization layer 150 positioned below the first moisture permeation prevention structure 331 is spaced apart from the continuous piece of the planarization layer 150 extended from the active area. Further, a piece of the planarization layer 150 positioned below the second moisture permeation prevention structure 332 is also spaced apart from the disconnected piece of the planarization layer 150 under the first moisture permeation prevention structure 331.

Referring to FIG. 2 to FIG. 5, an open area (or point) of the planarization layer 150 between the active area AA and the first moisture permeation prevention structure 331 may be an area in which the first contact hole 620 is formed. Between the first moisture permeation prevention structure 331 and the second moisture permeation prevention structure 332, an open area (or point) of the planarization layer 150 may be an area in which the second contact hole 630 is formed.

Referring to FIG. 2, FIG. 3 and FIG. 5, in a region in which the planarization layer 150 is opened between the active area AA and the first moisture permeation prevention structure 331 (e.g., a region corresponding to the first contact hole 620), the contact electrode 610 may be in electrical contact with the cathode electrode 243.

Referring to FIG. 3, in a region in which the planarization layer 150 is opened between the first moisture permeation prevention structure 331 and the second moisture prevention structure 332 (a region corresponding to the second contact hole 630), the contact electrode 610 may be additionally in electrical contact with the cathode electrode 243.

Referring to FIG. 5, there may be further provided an additional contact electrode 611 positioned in a region in which the planarization layer 150 is opened between the active area AA and the first moisture permeation prevention structure 331. The additional contact electrode 610 may be in electrical contact with at least one of the contact electrode 610 and the cathode electrode 243.

Referring to FIG. 4, in a region in which the planarization layer 150 is opened between the first moisture permeation prevention structure 331 and the second moisture prevention structure 332 (a region corresponding to the second contact hole 630),), the contact electrode 610 may be in electrical contact with the cathode electrode 243.

A display apparatus according to an embodiment of the present disclosure may include a liquid crystal display device (LCD), a field emission display device (FED), an organic light emitting display device (OLED), a quantum dot display device.

A display apparatus according to an embodiment of the present disclosure may include a display device of a laptop computers, televisions, computer monitors which are complete products or final products including LCM, OLED modules, an automotive display device or an equipment display apparatus including an or other form of a vehicle, and a set electronic device or a set device such as a mobile electronic device including a smart phone or an electronic pad.

A display apparatus according to an embodiment of the present disclosure may be described as follow.

A display apparatus according to an embodiment of the present disclosure may include a substrate including an active area and an inactive area disposed around the active area, an organic light emitting device disposed in the active area and including an anode electrode, a light emitting layer, and a cathode electrode, an encapsulation layer disposed on the organic light emitting device and including a first inorganic insulating layer, an organic insulating layer, and a second inorganic insulating layer, a touch unit disposed on the encapsulation layer and including a lower touch insulating layer, a touch electrode, and an upper touch insulating layer, a contact hole exposing an upper portion of the cathode electrode extending from the active area to the inactive area, and a contact electrode in electrical contact with the cathode electrode through the contact hole.

In a display apparatus according to an embodiment of the present disclosure, the touch electrode and the contact electrode may be formed of the same material.

A display apparatus according to an embodiment of the present disclosure may further include a moisture permeation prevention structure disposed in the vicinity of the contact hole.

A display apparatus according to an embodiment of the present disclosure may further include a crack stopper structure disposed between the end of the substrate and the moisture permeation prevention structure.

A display apparatus according to an embodiment of the present disclosure may further include a gate driver disposed in the inactive area, and the gate driver and the contact electrode may be disposed such that at least a portion of the gate driver and the contact electrode overlap.

In a display apparatus according to an embodiment of the present disclosure, the gate driver and the contact hole may be disposed so as not to overlap.

In a display apparatus according to an embodiment of the present disclosure, the organic insulating layer may be disposed so as not to overlap with the contact hole.

A display apparatus according to an embodiment of the present disclosure may further include a capping layer disposed between the organic light emitting device and the encapsulation layer.

In a display apparatus according to an embodiment of the present disclosure, the upper touch insulating layer may cover the moisture permeation prevention structure and may contact one wall of the crack stopper structure.

In a display apparatus according to an embodiment of the present disclosure, the contact electrode may descend along the inclined surface of the encapsulation layer and extend to the outer periphery of the substrate.

A display apparatus according to an embodiment of the present disclosure may further include a planarization layer disposed on the substrate and disposed in the active area and the inactive area, and a first moisture permeation prevention structure and a second moisture permeation prevention structure disposed on the outer periphery of the encapsulation layer and positioned on the planarization layer in the inactive area. The planarization layer may be open between the active area and the first moisture permeation prevention structure, and may be open between the first moisture permeation prevention structure and the second moisture permeation prevention structure.

In a display apparatus according to an embodiment of the present disclosure, in a region in which the planarization layer is opened between the active area and the first moisture permeation prevention structure, the contact electrode may be in electrical contact with the cathode electrode.

In a display apparatus according to an embodiment of the present disclosure, in a region in which the planarization layer is opened between the first moisture permeation prevention structure and the second moisture permeation prevention structure, the contact electrode may be additionally in electrical contact with the cathode electrode.

A display apparatus according to an embodiment of the present disclosure may further include an additional contact electrode located in the area where the planarization layer is open between the active area and the first moisture permeation prevention structure.

The additional contact electrode may be in electrical contact with at least one of the contact electrode and the cathode electrode.

A display apparatus according to an embodiment of the present disclosure may include a substrate including an active area and an inactive area disposed around the active area, an organic light emitting device disposed in the active area and including an anode electrode, a light emitting layer, and a cathode electrode, an encapsulation layer disposed on the organic light emitting device, a touch unit disposed on the encapsulation layer and including a lower touch insulating layer, a touch electrode, and an upper touch insulating layer, a contact hole exposing an upper portion of the cathode electrode by removing a portion of the lower touch insulating layer and the encapsulation layer, which the cathode electrode, the encapsulation layer and the lower touch insulating layer extending from the active area to the inactive area, and a contact electrode in electrical contact with the cathode electrode through the contact hole.

In a display apparatus according to an embodiment of the present disclosure, the touch electrode and the contact electrode may be formed by the same material and the same process.

In a display apparatus according to an embodiment of the present disclosure, the touch electrode and the contact electrode may be electrically disconnected.

A display apparatus according to an embodiment of the present disclosure may further include a moisture permeation prevention structure disposed in the vicinity of the contact hole.

A display apparatus according to an embodiment of the present disclosure may further include a crack stopper structure disposed between the end of the substrate and the moisture permeation prevention structure.

A display apparatus according to an embodiment of the present disclosure may further include a capping layer disposed between the organic light emitting device and the encapsulation layer.

In a display apparatus according to an embodiment of the present disclosure, the upper touch insulating layer may cover the moisture permeation prevention structure and may contact one wall of the crack stopper structure.

A display apparatus according to an embodiment of the present disclosure may further include a second contact electrode electrically connected to the cathode electrode and the contact electrode and disposed under the cathode electrode.

The features, structures, effects, and the like described in the examples of the present specification described above are included in at least one example of the present specification, and are not necessarily limited to only one example. Furthermore, the features, structures, effects, and the like exemplified in at least one example of the present specification may be combined or modified for other examples by those of ordinary skill in the art of the present specification. Accordingly, contents related to such combinations and modifications should be construed as being included in the scope of the present specification.

The present specification described above is not limited to the above-described embodiments and the accompanying drawings, and various substitutions, modifications, and changes will be readily apparent to those skilled in the art of the present specification without departing from the technical matters of the present disclosure. Therefore, the scope of the present specification includes all changes or modified forms derived from the meaning and scope of the claims and their equivalence should be interpreted as being included in the scope of the present specification.

The various embodiments described above can be combined to provide further embodiments. All of the U.S.

patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus comprising:
    a substrate including an active area and an inactive area disposed around the active area;
    an organic light emitting device disposed in the active area and including an anode electrode, a light emitting layer, and a cathode electrode;
    an encapsulation layer disposed on the organic light emitting device and including a first inorganic insulating layer, an organic insulating layer, and a second inorganic insulating layer;
    a touch unit disposed on the encapsulation layer and including a lower touch insulating layer, a touch electrode, and an upper touch insulating layer;
    a contact hole exposing an upper portion of the cathode electrode in the inactive area; and
    a contact electrode in electrical contact with the cathode electrode through the contact hole,
    wherein the cathode electrode extends from the active area to the inactive area.

2. The display apparatus of claim 1, wherein the touch electrode and the contact electrode are formed of a same material.

3. The display apparatus of claim 1, further comprising a moisture permeation prevention structure disposed adjacent to the contact hole.

4. The display apparatus of claim 3, further comprising a crack stopper structure disposed between an end of the substrate and the moisture permeation prevention structure.

5. The display apparatus of claim 2, further comprising a gate driver disposed in the inactive area, wherein the gate driver and the contact electrode are disposed to overlap at least a portion.

6. The display apparatus of claim 5, wherein the gate driver and the contact hole are disposed so as not to overlap with each other.

7. The display apparatus of claim 1, wherein the organic insulating layer is disposed so as not to overlap with the contact hole.

8. The display apparatus of claim 1, further comprising a capping layer disposed between the organic light emitting device and the encapsulation layer.

9. The display apparatus of claim 4, wherein the upper touch insulating layer at least partially covers the moisture permeation prevention structure and contacts one wall of the crack stopper structure.

10. The display apparatus of claim 1, wherein the contact electrode descends along an inclined surface of the encapsulation layer and extends to an outer periphery of the substrate.

11. The display apparatus of claim 1, further comprising:
    a planarization layer disposed on the substrate and disposed in the active area and the inactive area; and
    a first moisture permeation prevention structure and a second moisture permeation prevention structure disposed outside the encapsulation layer and positioned on the planarization layer in the inactive area,
    wherein the planarization layer is open between the active area and the first moisture permeation prevention structure, and is open between the first moisture permeation prevention structure and the second moisture permeation prevention structure.

12. The display apparatus of claim 11, wherein the contact electrode is in electrical contact with the cathode electrode in a region in which the planarization layer is opened between the active area and the first moisture permeation prevention structure.

13. The display apparatus of claim 12, wherein the contact electrode is additionally in electrical contact with the cathode electrode in a region in which the planarization layer is opened between the first moisture permeation prevention structure and the second moisture permeation prevention structure.

14. The display apparatus of claim 12, further comprising an additional contact electrode positioned in a region in which the planarization layer is opened between the active area and the first moisture permeation prevention structure, wherein the additional contact electrode is in electrical contact with at least one of the contact electrode and the cathode electrode.

15. The display apparatus of claim 11, wherein the contact electrode is in electrical contact with the cathode electrode in a region in which the planarization layer is opened between the first moisture permeation prevention structure and the second moisture permeation prevention structure.

16. A display apparatus comprising:
    a substrate including an active area and an inactive area disposed around the active area;
    an organic light emitting device disposed in the active area and including an anode electrode, a light emitting layer, and a cathode electrode;
    an encapsulation layer disposed on the organic light emitting device;
    a touch unit disposed on the encapsulation layer and including a lower touch insulating layer, a touch electrode, and an upper touch insulating layer;
    a contact hole exposing an upper portion of the cathode electrode by removing a portion of the lower touch insulating layer and the encapsulation layer, which the cathode electrode, the encapsulation layer and the lower touch insulating layer extending from the active area to the inactive area; and
    a contact electrode in electrical contact with the cathode electrode through the contact hole.

17. The display apparatus of claim 16, wherein the touch electrode and the contact electrode are formed by a same material and a same process.

18. The display apparatus of claim 16, wherein the touch electrode and the contact electrode are electrically disconnected.

19. The display apparatus of claim 16, further comprising a moisture permeation prevention structure disposed in a vicinity of the contact hole.

20. The display apparatus of claim 19, further comprising a crack stopper structure disposed between an end of the substrate and the moisture permeation prevention structure.

21. The display apparatus of claim 16, further comprising a capping layer disposed between the organic light emitting device and the encapsulation layer.

22. The display apparatus of claim 20, wherein the upper touch insulating layer at least partially covers the moisture permeation prevention structure and contacts one wall of the crack stopper structure.

23. The display apparatus of claim 16, further comprising a second contact electrode electrically coupled to the cathode electrode and the contact electrode, and disposed under the cathode electrode.

* * * * *